（12） United States Patent
Hamanaka et al.

(10) Patent No.: US 10,283,273 B2
(45) Date of Patent: May 7, 2019

(54) METHOD OF MANUFACTURING A CERAMIC ELECTRONIC COMPONENT

(71) Applicant: Murata Manufacturing Co., Ltd., Nagaokakyo-shi, Kyoto-fu (JP)

(72) Inventors: Kenichi Hamanaka, Nagaokakyo (JP); Kota Zenzai, Nagaokakyo (JP); Taku Dekura, Nagaokakyo (JP); Kiyotaka Maegawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 164 days.

(21) Appl. No.: 15/418,865

(22) Filed: Jan. 30, 2017

(65) Prior Publication Data

US 2017/0140874 A1 May 18, 2017

Related U.S. Application Data

(62) Division of application No. 14/305,096, filed on Jun. 16, 2014, now Pat. No. 9,595,375.

(30) Foreign Application Priority Data

Jun. 19, 2013 (JP) .................................. 2013-128280
Apr. 23, 2014 (JP) .................................. 2014-089234

(51) Int. Cl.
*H01G 4/30* (2006.01)
*H01C 7/00* (2006.01)
(Continued)

(52) U.S. Cl.
CPC ............... *H01G 4/30* (2013.01); *H01C 1/148* (2013.01); *H01C 7/008* (2013.01); *H01C 7/18* (2013.01);
(Continued)

(58) Field of Classification Search
CPC ........ H01G 4/12; H01G 4/228; H01G 4/2325; H01G 4/232; H01G 4/30; H01C 1/148;
(Continued)

(56) References Cited

FOREIGN PATENT DOCUMENTS

JP     2000-182883    *  6/2000
JP     2003-282351 A    10/2003
(Continued)

OTHER PUBLICATIONS

Hamanaka et al., "Ceramic Electronic Component and Method of Manufacturing the Same", U.S. Appl. No. 14/305,096, filed Jun. 16, 2014.
(Continued)

*Primary Examiner* — Carl J Arbes
(74) *Attorney, Agent, or Firm* — Keating & Bennett, LLP

(57) ABSTRACT

A ceramic electronic component includes a rectangular or substantially rectangular parallelepiped-shaped stack in which a ceramic layer and an internal electrode are alternately stacked and an external electrode provided on a portion of a surface of the stack and electrically connected to the internal electrode. The external electrode includes an inner external electrode covering a portion of the surface of the stack and including a mixture of a resin component and a metal component and an outer external electrode covering the inner external electrode and including a metal component. A volume occupied by the resin component in the inner external electrode is within a prescribed range.

8 Claims, 5 Drawing Sheets

(51) Int. Cl.
    *H01F 27/29*     (2006.01)
    *H01L 41/047*     (2006.01)
    *H01L 41/293*     (2013.01)
    *H01C 1/148*     (2006.01)
    *H01C 7/18*     (2006.01)
    *H01G 4/232*     (2006.01)
    *H01C 17/28*     (2006.01)
    *H01F 17/00*     (2006.01)

(52) U.S. Cl.
    CPC .......... *H01C 17/288* (2013.01); *H01F 27/29* (2013.01); *H01F 27/292* (2013.01); *H01G 4/232* (2013.01); *H01G 4/2325* (2013.01); *H01L 41/0472* (2013.01); *H01L 41/293* (2013.01); *H01F 17/0013* (2013.01); *Y10T 29/417* (2015.01); *Y10T 29/42* (2015.01); *Y10T 29/4902* (2015.01); *Y10T 29/49085* (2015.01)

(58) Field of Classification Search
    CPC ... H01C 17/288; H01C 17/0013; H01F 27/29; H01F 27/292; H01L 41/0472; H01L 41/293; Y10T 29/317; Y10T 29/42; Y10T 29/4902; Y10T 29/49085
    See application file for complete search history.

(56) References Cited

FOREIGN PATENT DOCUMENTS

| | | | |
|---|---|---|---|
| JP | 2011-003612 | * | 1/2011 |
| JP | 2011-003612 A | | 1/2011 |

OTHER PUBLICATIONS

Official Communication issued in corresponding Japanese Patent Application No. 2014-89234, dated May 8, 2018.

\* cited by examiner

METHOD OF MANUFACTURING A CERAMIC ELECTRONIC COMPONENT

BACKGROUND OF THE INVENTION

Field of the Invention

The present invention relates to a ceramic electronic component and a method of manufacturing the same.

Description of the Related Art

Ceramic electronic components represented by stack ceramic capacitors have recently been used in an environment that is more severe than in a conventional example.

For example, electronic components included in mobile devices such as a portable telephone and a portable music player are required to be resistant to shock at the time of a drop. Specifically, electronic components are required not to be detached from amounting board and to be free from cracks when a drop impact is applied thereto.

Electronic components included in car-mounted devices such as an ECU (Engine Control Unit) are required to be resistant to shock originating from a heat cycle. Specifically, electronic components are required to be free from cracks in solder used for mounting and in body of the components themselves when bending stress resulting from thermal expansion and contraction of amounting board originating from a heat cycle is applied thereto.

In order to satisfy the requirements above, use of a thermosetting conductive paste for an external electrode of a ceramic electronic component, instead of a conventional firing-type conductive paste, has been proposed.

WO2004/053901 discloses a stack ceramic electronic component having an external electrode formed of a thermosetting conductive paste.

In the stack ceramic electronic component described in WO2004/053901, an external electrode is formed through plating of an external electrode layer formed of a thermosetting conductive paste containing a resin and metal powders having a melting point not higher than 300° C.

In general, a resin is high in hygroscopicity and tends to absorb moisture. As a resin which has absorbed moisture is heated, moisture is vaporized and water vapor is generated in the resin, and in addition, some of the resin is decomposed to generate a decomposition gas.

In a case that an external electrode is formed through plating of an external electrode layer formed of a thermosetting conductive paste containing a resin as in the stack ceramic electronic component described in WO2004/053901, heating in a reflow step in mounting the stack ceramic electronic component leads to generation of water vapor and a decomposition gas in the external electrode. The water vapor and the decomposition gas are confined by a plating film on a surface of the external electrode.

In a case that a defective portion or a partially thin portion is present in a plating film, the confined water vapor and decomposition gas may burst from the defective portion or the thin portion to the outside of the external electrode. This burst causes such a phenomenon that solder molten in the reflow step is blown off, which is generally called "solder burst".

In a case that a thermosetting conductive paste is directly applied to a ceramic stack as in the stack ceramic electronic component described in WO2004/053901, moisture contained in the ceramic stack is absorbed in the resin in the external electrode. Then, an amount of water vapor generated during heating increases, and solder burst is more likely.

SUMMARY OF THE INVENTION

Preferred embodiments of the present invention provide a ceramic electronic component and a method of manufacturing the same, which significantly reduce or prevent the occurrence of solder burst.

A ceramic electronic component according to a preferred embodiment the present invention preferably is a ceramic electronic component having an outer dimension of a length not smaller than about 0.57 mm and not greater than about 0.65 mm, a width not smaller than about 0.27 mm and not greater than about 0.35 mm, and a thickness not smaller than about 0.27 mm and not greater than about 0.35 mm, for example. The ceramic electronic component includes a rectangular or substantially rectangular parallelepiped-shaped stack in which a ceramic layer and an internal electrode are alternately stacked and an external electrode provided on a portion of a surface of the stack and electrically connected to the internal electrode. The external electrode includes an inner external electrode covering a portion of the surface of the stack and including a mixture of a resin component and a metal component and an outer external electrode covering the inner external electrode and including a metal component. A volume occupied by the resin component in the inner external electrode preferably is not lower than about $3.79 \times 10^{-7}$ ml and not higher than about $1.02 \times 10^{-6}$ ml, for example.

A ceramic electronic component according to a further preferred embodiment of the present invention preferably is a ceramic electronic component having an outer dimension of a length not smaller than about 0.95 mm and not greater than about 1.20 mm, a width not smaller than about 0.45 mm and not greater than about 0.70 mm, and a thickness not smaller than about 0.45 mm and not greater than about 0.70 mm, for example. The ceramic electronic component includes a rectangular or substantially rectangular parallelepiped-shaped stack in which a ceramic layer and an internal electrode are alternately stacked and an external electrode provided on a portion of a surface of the stack and electrically connected to the internal electrode. The external electrode includes an inner external electrode covering a portion of the surface of the stack and including a mixture of a resin component and a metal component and an outer external electrode covering the inner external electrode and composed of a metal component. A volume occupied by the resin component in the inner external electrode preferably is not lower than about $5.23 \times 10^{-7}$ ml and not higher than about $2.53 \times 10^{-6}$ ml, for example.

A ceramic electronic component according to an additional preferred embodiment of the present invention preferably is a ceramic electronic component having an outer dimension of a length not smaller than about 1.5 mm and not greater than about 1.8 mm, a width not smaller than about 0.7 mm and not greater than about 1.0 mm, and a thickness not smaller than about 0.7 mm and not greater than about 1.0 mm, for example. The ceramic electronic component includes a rectangular or substantially rectangular parallelepiped-shaped stack in which a ceramic layer and an internal electrode are alternately stacked and an external electrode provided on a portion of a surface of the stack and electrically connected to the internal electrode. The external electrode includes an inner external electrode covering a portion of the surface of the stack and including a mixture of a resin component and a metal component and an outer external electrode covering the inner external electrode and composed of a metal component. A volume occupied by the resin component in the inner external electrode preferably is not lower than about $1.94 \times 10^{-6}$ ml and not higher than about $2.84 \times 10^{-6}$ ml, for example.

A method of manufacturing a ceramic electronic component according to another preferred embodiment of the present invention preferably is a method of manufacturing a ceramic electronic component having an outer dimension of a length not smaller than about 0.57 mm and not greater than about 0.65 mm, a width not smaller than about 0.27 mm and not greater than about 0.35 mm, and a thickness not smaller than about 0.27 mm and not greater than about 0.35 mm, for example. The method of manufacturing a ceramic electronic component includes the steps of preparing a rectangular or substantially rectangular parallelepiped-shaped stack in which a ceramic layer and an internal electrode are alternately stacked and providing an external electrode on a portion of a surface of the stack so as to electrically be connected to the internal electrode. The step of providing an external electrode includes the steps of providing an inner external electrode by applying a mixture of a resin component and a metal component so as to cover a portion of the surface of the stack and heating the stack onto which the mixture has been applied and providing an outer external electrode by plating the inner external electrode with a metal component so as to cover the inner external electrode. A content of the metal component in the mixture preferably is not lower than about 46 volume % and not higher than about 79 volume %, for example.

A method of manufacturing a ceramic electronic component according to another preferred embodiment of the present invention preferably is a method of manufacturing a ceramic electronic component having an outer dimension of a length not smaller than about 0.95 mm and not greater than about 1.20 mm, a width not smaller than about 0.45 mm and not greater than about 0.70 mm, and a thickness not smaller than about 0.45 mm and not greater than about 0.70 mm, for example. The method of manufacturing a ceramic electronic component includes the steps of preparing a rectangular or substantially rectangular parallelepiped-shaped stack in which a ceramic layer and an internal electrode are alternately stacked and providing an external electrode on a portion of a surface of the stack so as to electrically be connected to the internal electrode. The step of providing an external electrode includes the steps of providing an inner external electrode by applying a mixture of a resin component and a metal component so as to cover a portion of the surface of the stack and heating the stack onto which the mixture has been applied and providing an outer external electrode by plating the inner external electrode with a metal component so as to cover the inner external electrode. A content of the metal component in the mixture preferably is not lower than about 60 volume % and not higher than about 82 volume %, for example.

A method of manufacturing a ceramic electronic component according to a further preferred embodiment of the present invention preferably is a method of manufacturing a ceramic electronic component having an outer dimension of a length not smaller than about 1.5 mm and not greater than about 1.8 mm, a width not smaller than about 0.7 mm and not greater than about 1.0 mm, and a thickness not smaller than about 0.7 mm and not greater than about 1.0 mm, for example. The method of manufacturing a ceramic electronic component includes the steps of preparing a rectangular or substantially rectangular parallelepiped-shaped stack in which a ceramic layer and an internal electrode are alternately stacked and providing an external electrode on a portion of a surface of the stack so as to electrically be connected to the internal electrode. The step of providing an external electrode includes the steps of providing an inner external electrode by applying a mixture of a resin component and a metal component so as to cover a portion of the surface of the stack and heating the stack onto which the mixture has been applied and providing an outer external electrode by plating the inner external electrode with a metal component so as to cover the inner external electrode. A content of the metal component in the mixture preferably is not lower than about 71 volume % and not higher than about 79 volume %, for example.

The metal component of the inner external electrode preferably includes a first metal component and a second metal component higher in melting point than the first metal component.

A content of the first metal component in the mixture preferably is not lower than about 20 weight % and not higher than about 40 weight %, for example.

A content of the second metal component in the mixture preferably is not lower than about 30 weight % and not higher than about 70 weight %, for example.

The first metal component preferably is Sn, for example.

The second metal component preferably is Ag or Cu, for example.

The metal component of the outer external electrode preferably is Ni, for example.

A temperature for heating the stack in the step of providing an inner external electrode preferably is not lower than about 450° C., for example.

In the step of providing an inner external electrode, the stack preferably is heated in an atmosphere in which a concentration of oxygen is not higher than about 100 ppm, for example.

According to various preferred embodiments of the present invention, the occurrence of solder burst is significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
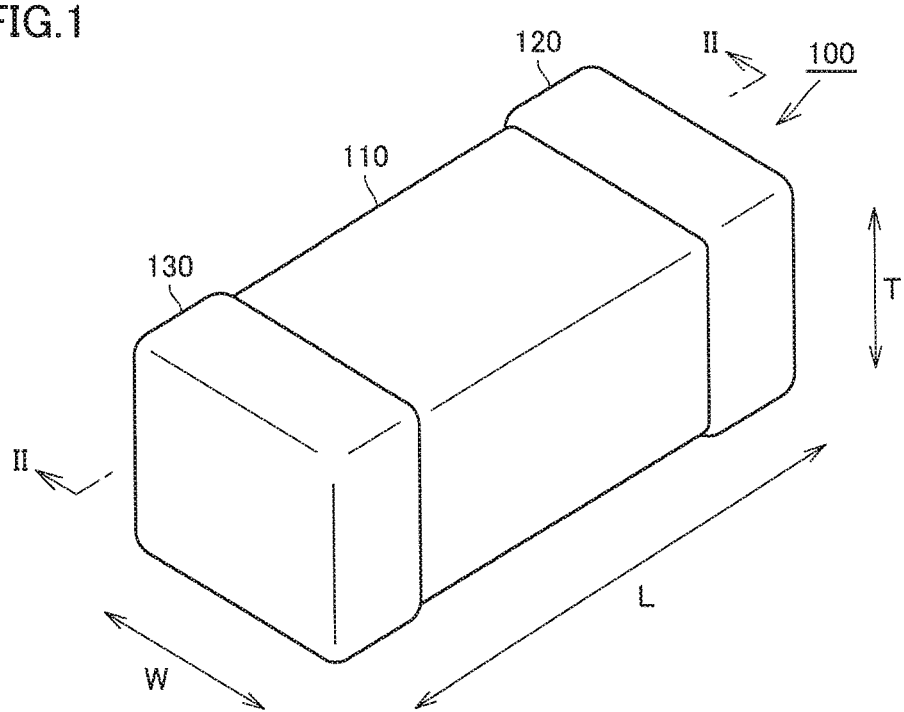
FIG. 1 is a perspective view showing an appearance of a ceramic electronic component according to a first preferred embodiment of the present invention.

A ceramic electronic component according to preferred embodiments of the present invention will be described hereinafter with reference to the drawings. In the description of the preferred embodiments below, the same or corresponding elements in the drawings have the same reference numerals allotted and description thereof will not be repeated. Though a ceramic capacitor will be described as a ceramic electronic component in the description below, the electronic component is not limited to a capacitor, and the electronic component includes a piezoelectric component, a thermistor, or an inductor, for example.

First Preferred Embodiment

Figure 2:
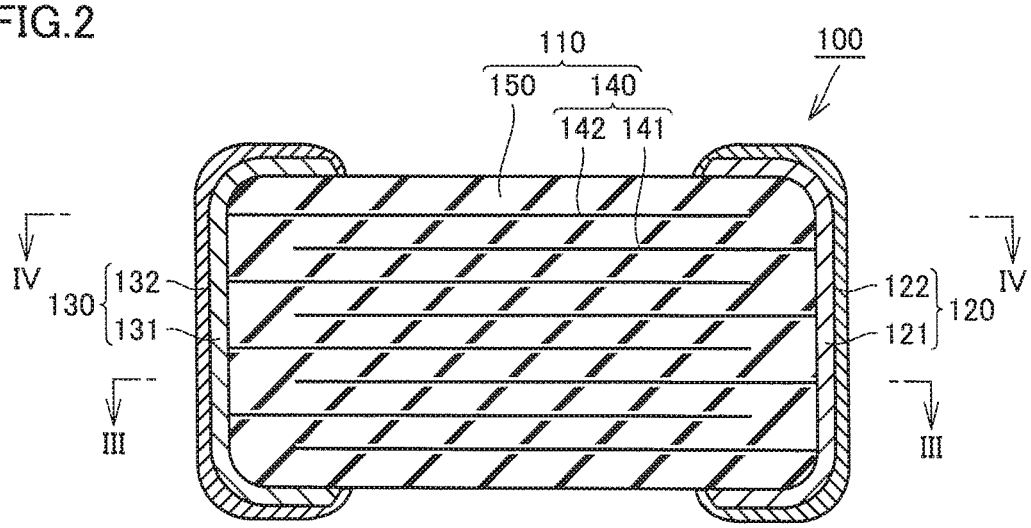
FIG. 2 is a cross-sectional view of the ceramic electronic component in FIG. 1 viewed in a direction shown with an arrow along the line II-II.
Figure 3:
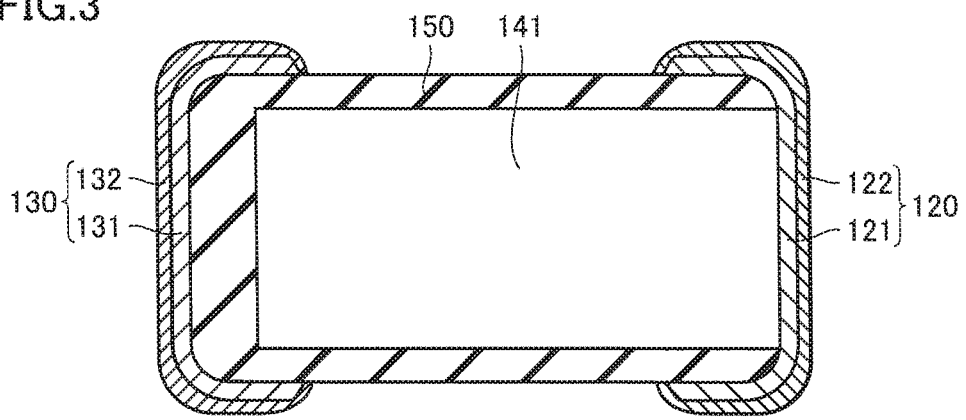
FIG. 3 is a cross-sectional view of the ceramic electronic component in FIG. 2 viewed in a direction shown with an arrow along the line III-III.
Figure 4:
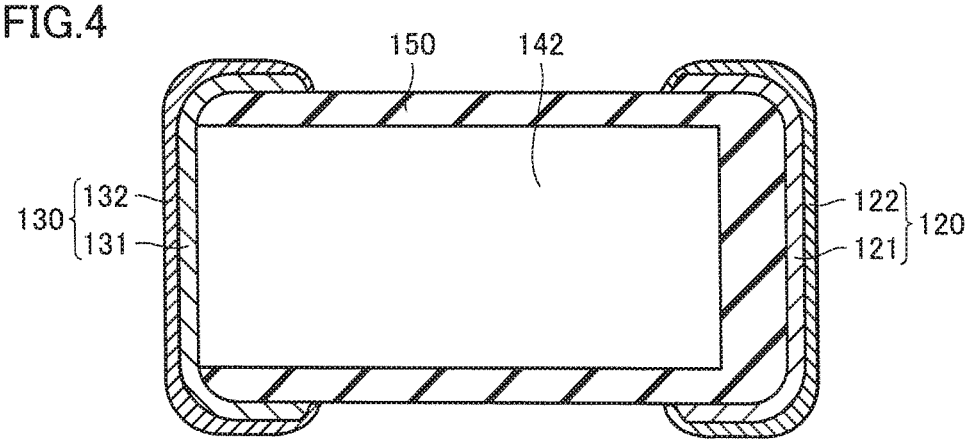
FIG. 4 is a cross-sectional view of the ceramic electronic component in FIG. 2 viewed in a direction shown with an arrow along the line IV-IV.

FIG. 1 is a perspective view showing an appearance of a ceramic electronic component according to a first preferred embodiment of the present invention. FIG. 2 is a cross-sectional view of the ceramic electronic component in FIG. 1 viewed in a direction shown with an arrow along the line II-II. FIG. 3 is a cross-sectional view of the ceramic electronic component in FIG. 2 viewed in a direction shown with an arrow along the line III-III. FIG. 4 is a cross-sectional view of the ceramic electronic component in FIG. 2 viewed in a direction shown with an arrow along the line IV-IV. FIG. 1 shows a longitudinal direction L of a stack which will be described later, a width direction W of the stack, and a thickness direction T of the stack.

As shown in FIGS. 1 to 4, a ceramic electronic component 100 according to the first preferred embodiment of the present invention includes a rectangular or substantially rectangular parallelepiped-shaped stack 110 in which a ceramic layer 150 and a flat-plate-shaped internal electrode 140 are alternately stacked and an external electrode provided on a portion of a surface of stack 110 and electrically connected to internal electrode 140.

In the present preferred embodiment, the external electrode is provided in each of opposing end portions of stack 110. Specifically, the external electrode includes a first external electrode 120 provided at one end portion in a longitudinal direction of stack 110 and a second external electrode 130 provided at the other end portion in the longitudinal direction of stack 110.

Of internal electrodes 140 opposed adjacently to each other, a first internal electrode 141 is electrically connected to first external electrode 120, and a second internal electrode 142 is electrically connected to second external electrode 130.

In stack 110 according to the present preferred embodiment, a direction of stack of ceramic layer 150 and internal electrode 140 is perpendicular or substantially perpendicular to longitudinal direction L of stack 110 and width direction W of stack 110. Namely, a direction of stack of ceramic layer 150 and internal electrode 140 is in parallel or substantially parallel to thickness direction T of stack 110.

Stack 110 includes a pair of main surfaces perpendicular or substantially perpendicular to thickness direction T, a pair of end surfaces perpendicular or substantially perpendicular to longitudinal direction L, and a pair of side surfaces perpendicular or substantially perpendicular to width direction W.

As described above, though stack 110 has an outer shape like a rectangular or substantially rectangular parallelepiped, it may be rounded in at least one of a corner portion and a ridgeline portion. Namely, a shape like a rectangular or substantially rectangular parallelepiped includes a rectangular or substantially rectangular parallelepiped rounded in at least one of a corner portion and a ridgeline portion. A rectangular or substantially rectangular parallelepiped-shaped member generally means a member including a pair of main surfaces, a pair of side surfaces, and a pair of end surfaces. In stack 110, any surface of the pair of main surfaces, the pair of side surfaces, and the pair of side surfaces may include projections and recesses.

Each ceramic layer 150 has a thickness preferably not smaller than about 0.5 μm and not greater than about 10 μm, for example. As a material for forming ceramic layer 150, dielectric ceramics mainly composed of $BaTiO_3$, $CaTiO_3$, $SrTiO_3$, or $CaZrO_3$ can be used, for example. A material in which a Mn compound, a Fe compound, a Cr compound, a Co compound, or a Ni compound is added as a sub component to such a main component may preferably be used, for example.

In a case that an electronic component is a piezoelectric component, stack 110 preferably is made of piezoelectric ceramics. For example, PZT (lead zirconate titanate)-based ceramics is available as piezoelectric ceramics.

In a case that an electronic component is a thermistor, stack 110 preferably is made of semiconductor ceramics. For example, spinel-type ceramics is available as semiconductor ceramics.

In a case that an electronic component is an inductor, stack 110 preferably is made of magnetic ceramics. For example, ferrite ceramics is available as magnetic ceramics.

In the present preferred embodiment, stack 110 preferably has an outer dimension of a length not smaller than about 0.51 mm and not greater than about 0.59 mm, a width not smaller than about 0.24 mm and not greater than about 0.32 mm, and a thickness not smaller than about 0.24 mm and not greater than about 0.32 mm, for example.

Each internal electrode 140 preferably has a thickness preferably not smaller than about 0.2 μm and not greater than about 2.0 μm. Internal electrode 140 includes first internal electrode 141 substantially in a rectangular shape in a two-dimensional view and second internal electrode 142 substantially in a rectangular shape in a two-dimensional view. First internal electrode 141 and second internal electrode 142 are alternately arranged at regular intervals along thickness direction T of stack 110. First internal electrode 141 and second internal electrode 142 are arranged to be opposed to each other, with ceramic layer 150 lying therebetween.

First internal electrode 141 extends from one end portion in the longitudinal direction of stack 110 toward the other end portion. As shown in FIG. 3, first internal electrode 141 is connected to first external electrode 120 in one end surface of stack 110.

Second internal electrode 142 extends from the other end portion in the longitudinal direction of stack 110 toward one end portion. As shown in FIG. 4, second internal electrode 142 is connected to second external electrode 130 in the other end surface of stack 110.

As a material for forming internal electrode 140, a metal such as Ni, Cu, Ag, Pd, or Au or an alloy containing at least one of these metals such as an alloy of Ag and Pd may preferably be used, for example. A material forming internal electrode 140 forms an alloy as a result of chemical combination with a first metal component contained in a mixture forming an inner external electrode which will be described later.

The external electrode includes an inner external electrode covering each of opposing end portions of stack 110 and includes a mixture of a resin component and a metal component and an outer external electrode covering the inner external electrode and composed of a metal component. As a resin component, a thermosetting resin such as an epoxy resin or a phenol resin preferably is used. A thickness of the inner external electrode is preferably not smaller than 5.0 μm and not greater than 70.0 μm.

As shown in FIGS. 2 to 4, first external electrode 120 includes a first inner external electrode 121 and a first outer external electrode 122. First inner external electrode 121 covers one end portion in the longitudinal direction of stack 110. A portion of first inner external electrode 121 forms an alloy together with a portion of first internal electrode 141.

Second external electrode 130 includes a second inner external electrode 131 and a second outer external electrode 132. Second inner external electrode 131 covers the other end portion in the longitudinal direction of stack 110. A portion of second inner external electrode 131 forms an alloy together with a portion of second internal electrode 142.

In the present preferred embodiment, the inner external electrode includes, as a metal component, a first metal component and a second metal component higher in melting point than the first metal component. A melting point of the first metal component is preferably not higher than about 550° C. and further preferably not lower than about 180° C. and not higher than about 340° C., for example. A melting point of the second metal component is preferably not lower than about 850° C. and not higher than about 1050° C., for example.

As the first metal component, a metal such as Sn, In, or Bi or an alloy containing at least one of these metals preferably is used. As the first metal component, an alloy containing Sn such as an alloy of Sn and Ag, an alloy of Sn and Bi, or an alloy of Sn, Ag, and Cu, or Sn is preferably used. By using such a metal component, an alloy layer of internal electrode 140 and the inner external electrode are easily formed, and hence electrical connection between internal electrode 140 and the inner external electrode is easily and reliably established.

The first metal component is softened and fluidized through heating in a reflow step in mounting ceramic electronic component 100, and chemically combined with a material forming internal electrode 140 to form an alloy.

A content of the first metal component in a heated and cured mixture is preferably not lower than about 8 volume % and not higher than about 18 volume %, for example.

As the second metal component, a metal such as Ag, Cu, Pd, Pt, or Au or an alloy containing at least one of these metals preferably is used. As the second metal component, an alloy containing Ag such as an alloy of Ag and Pd, or Ag, or Cu is preferably used.

The second metal component defines a conduction path within the inner external electrode. The second metal component defines an alloy as a result of chemical combination with the first metal component. A content of the second metal component in a heated and cured mixture is preferably not lower than about 19 volume % and not higher than about 25 volume %, for example.

First outer external electrode 122 covers first inner external electrode 121. A portion of first outer external electrode 122 forms an alloy together with a portion of first inner external electrode 121. Second outer external electrode 132 covers second inner external electrode 131. A portion of second outer external electrode 132 forms an alloy together with a portion of second inner external electrode 131.

In the present preferred embodiment, a metal component of the outer external electrode is Ni. A metal component of the outer external electrode is not limited to Ni, and it may be Cu. The outer external electrode defines and functions as a solder barrier layer. A thickness of the outer external electrode is preferably not smaller than about 1.0 μm and not greater than about 15.0 μm, for example.

In the present preferred embodiment, the external electrode further includes a not-shown surface external electrode covering the outer external electrode. As a material for forming the surface external electrode, a metal such as Sn or Au having good solder wettability or an alloy containing at least one of these metals is preferably used. A thickness of the surface external electrode is preferably not smaller than about 1.0 μm and not greater than about 15.0 μm, for example.

Ceramic electronic component 100 according to the present preferred embodiment preferably has an outer dimension of a length not smaller than about 0.57 mm and not greater than about 0.65 mm, a width not smaller than about 0.27 mm and not greater than about 0.35 mm, and a thickness not smaller than about 0.27 mm and not greater than about 0.35 mm, for example.

As the inner external electrode contains a resin component, it functions as a buffer layer. Namely, when a physical shock or a shock originating from a heat cycle is applied to ceramic electronic component 100, the resin component in the inner external electrode absorbs the shock. Consequently, occurrence of a crack in solder used for mounting and in ceramic electronic component 100 itself is significantly reduced or prevented.

In a case that an amount of the resin component in the inner external electrode is insufficient, adhesion between stack 110 and the inner external electrode is lowered and cohesive force of the inner external electrode is lowered. Therefore, in a case that an amount of the resin component in the inner external electrode is insufficient, shock resistance of the inner external electrode is lowered. In this case, when a shock is applied to mounted ceramic electronic component 100, the inner external electrode is broken and ceramic electronic component 100 is likely to be detached from the mounting board.

In contrast, in a case that an amount of the resin component in the inner external electrode is large, an amount of moisture absorbed in the resin component is large and solder burst is likely. Therefore, an amount of the resin component in the inner external electrode should be small within such a range that the inner external electrode can function as a buffer layer.

In ceramic electronic component 100 according to the present preferred embodiment, a volume occupied by the resin component in the inner external electrode preferably is not lower than about $3.79 \times 10^{-7}$ ml and not higher than about $1.02 \times 10^{-6}$ ml, for example.

By thus lowering a volume occupied by the resin component in the inner external electrode, an amount of moisture absorbed by the resin component and an amount of the resin component itself is decreased. Consequently, an amount of water vapor and an amount of a decomposition gas generated in the external electrode through heating in a reflow step in mounting ceramic electronic component 100 are decreased, so that occurrence of solder burst is significantly reduced or prevented.

Figure 5:
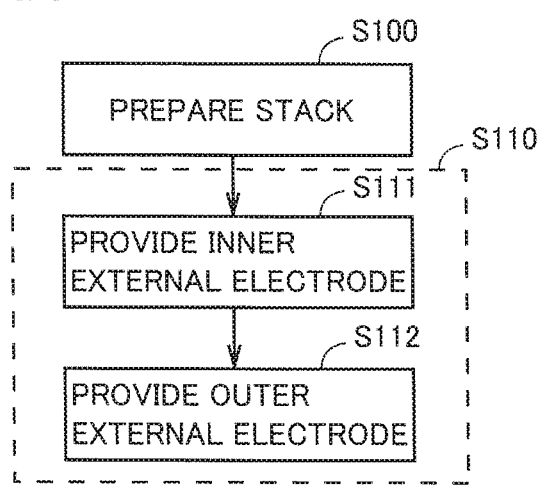
FIG. 5 is a flowchart showing a method of manufacturing a ceramic electronic component according to the first preferred embodiment of the present invention.

A method of manufacturing a ceramic electronic component according to the present preferred embodiment will be described below with reference to the drawings. FIG. 5 is a flowchart showing a method of manufacturing a ceramic electronic component according to the present preferred embodiment.

As shown in FIG. 5, rectangular or substantially rectangular parallelepiped-shaped stack 110 in which ceramic layer 150 and internal electrode 140 are alternately stacked is prepared (S100). Stack 110 is fabricated as below.

Initially, a ceramic green sheet is fabricated by applying a ceramic paste containing ceramic powders into a sheet with screen printing and drying the paste.

In some of a plurality of fabricated ceramic green sheets, a conductive paste used to provide an internal electrode is applied onto the ceramic green sheet in a prescribed pattern with screen printing, for example. Thus, a ceramic green sheet including a conductive pattern to define an internal electrode and a ceramic green sheet not including a conductive pattern are prepared. The ceramic paste and the conductive paste used to provide an internal electrode may contain a binder and a solvent which are known.

A mother stack is fabricated by stacking a prescribed number of ceramic green sheets not having a conductive pattern formed thereon, successively stacking thereon a plurality of ceramic green sheets having a conductive pattern formed thereon, and stacking further thereon a prescribed number of ceramic green sheets not having a conductive pattern formed thereon. A mother stack may be pressed in a direction of stack using isostatic pressing as necessary, for example.

By cutting and dividing the mother stack in a prescribed shape, a plurality of rectangular or substantially rectangular parallelepiped-shaped soft stacks are fabricated. A rectangular or substantially rectangular parallelepiped-shaped soft stack may be subjected to barrel polishing so as to round a corner portion of the soft stack.

Stack 110 is fabricated by curing the soft stack by firing the same. A firing temperature is set as appropriate depending on a type of a ceramic material and a conductive material, and for example, a temperature is set within a range not lower than about 900° C. and not higher than about 1300° C.

Then, a mixture paste which is a mixture containing a resin component such as a thermosetting resin, a first metal filler including a first metal component, and a second metal filler including a second metal component higher in melting point than the first metal component is prepared. A weight ratio (a content) of the first metal filler to a total weight of the first metal filler, the second metal filler, and the resin component in the mixture paste is preferably not lower than about 20 weight % and not higher than about 40 weight % and more preferably not lower than about 22.0 weight % and not higher than about 37.2 weight %, for example.

In a case that a content of the first metal filler is too low, an amount of an alloy formed as a result of chemical combination with a material forming internal electrode 140 is insufficient, and electrical connection between internal electrode 140 and the external electrode cannot be ensured.

In a case that a content of the first metal filler is too high, an amount of the first metal filler which does not react with the second metal filler but remains increases. In this case, the external electrode may deform due to heating in a reflow step in mounting ceramic electronic component 100. A shape of the first metal filler is not particularly limited, and it may be spherical or flat. An average particle size of the first metal filler is not particularly limited, and for example, it is preferably not smaller than about 1.0 µm and not greater than about 10 µm.

A weight ratio (a content) of the second metal filler to a total weight of the first metal filler, the second metal filler, and the resin component in the mixture paste is preferably not lower than about 30 weight % and not higher than about 70 weight % and more preferably not lower than about 41.2 weight % and not higher than about 64 weight %.

In a case that a content of the second metal filler is too low, conductivity of the external electrode is lowered and equivalent series resistance (ESR) of ceramic electronic component 100 may become high.

In a case that a content of the second metal filler is too high, a content of the resin component in the inner external electrode is low, and the inner external electrode may not function as a buffer layer. A shape of the second metal filler is not particularly limited, and it may be spherical or flat. An average particle size of the second metal filler is not particularly limited, and for example, it may preferably be not smaller than about 0.5 µm and not greater than about 5.0 µm.

A weight ratio (a content) of the resin component to a total weight of the first metal filler, the second metal filler, and the resin component in the mixture paste is preferably not lower than about 5 weight % and not higher than about 40 weight % and more preferably not lower than about 9.8 weight % and not higher than about 31.5 weight %, for example.

In a case that a content of the resin component is too low, the inner external electrode may not function as a buffer layer. In a case that a content of the resin component is too high, conductivity of the external electrode is lowered and equivalent series resistance (ESR) of ceramic electronic component 100 may become high.

The inner external electrode is provided by applying the mixture paste to a portion of the surface of stack 110 with various printing methods or dipping and heating stack 110 to which the mixture paste has been applied (S111).

In the step of providing an inner external electrode (S111), stack 110 to which the mixture paste has been applied is preferably heated in a neutral atmosphere such as a nitrogen gas atmosphere or a reducing atmosphere or another non-oxidizing atmosphere. Specifically, stack 110 to which the mixture paste has been applied is preferably heated in an atmosphere in which a concentration of oxygen preferably is not higher than about 100 ppm, for example.

A temperature for heating stack 110 to which the mixture paste has been applied is preferably not lower than a temperature at which a crystal state in an alloy of the first metal component and the second metal component thermodynamically changes (a temperature range in which diffusion of the first metal component of the inner external electrode toward the internal electrode is promoted). Specifically, a temperature for heating stack 110 to which the mixture paste has been applied is preferably not lower than about 450° C., for example. In a case that stack 110 to which the mixture paste has been applied is heated at such a temperature, an alloy layer of internal electrode 140 and the inner external electrode is formed to extend from an end portion of internal electrode 140 toward the inner external electrode.

In a case that a temperature for heating stack 110 to which the mixture paste has been applied is lower than about 450° C., an amount of the resin component which remains in the inner external electrode increases and hence occurrence of solder burst is less likely to be suppressed, which is not preferred.

In contrast, in a case that a temperature for heating stack 110 to which the mixture paste has been applied is too high, the inner external electrode cannot be formed in a stable manner. Therefore, a temperature for heating stack 110 to which the mixture paste has been applied is preferably lower than about 800° C. and more preferably not higher than about 650° C., for example.

In the present preferred embodiment, a temperature for heating stack 110 to which the mixture paste has been applied and an amount of a metal component contained in the mixture paste are adjusted so as to set an amount of the resin component contained in the inner external electrode to a desired amount. By raising a heating temperature, the resin component contained in the inner external electrode can more likely to be released. By changing an amount of the inner external electrode itself by adjusting a thickness of the inner external electrode as well, an amount of the resin component contained in the inner external electrode is set to a desired amount. Therefore, even in a case that an amount of the resin component contained in the mixture paste is relatively large, an amount of the resin component contained in the inner external electrode is set to a desired amount by adjusting at least one of a heating temperature and a thickness of the inner external electrode.

Then, an outer external electrode is provided on the inner external electrode by bonding a metal component with plating or the like (S112). Electrolytic plating is preferred as a method of providing an outer external electrode, for example.

A surface external electrode is further provided on the outer external electrode by bonding a metal component with plating or the like. Electrolytic plating is preferred as a method of providing a surface external electrode, for example.

Through the step of providing an inner external electrode (S111) and the step of providing an outer external electrode (S112) and providing a surface external electrode, the external electrode is provided on a portion of the surface of stack 110 so as to electrically be connected to internal electrode 140 (S110).

Ceramic electronic component 100 according to the present preferred embodiment preferably is fabricated through the step of preparing stack 110 (S100) and the step of providing an external electrode (S110).

As described above, in the method of manufacturing ceramic electronic component 100 according to the present preferred embodiment, a desired amount of resin component is provided in an inner external electrode, so that solder burst is significantly reduced or prevented while a function of the inner external electrode as a buffer layer is maintained.

A ceramic electronic component and a method of manufacturing the same according to a second preferred embodiment of the present invention will be described below. The ceramic electronic component and the method of manufacturing the same according to the second preferred embodiment of the present invention are different from the ceramic electronic component and the method of manufacturing the same according to the first preferred embodiment only in an outer dimension of the ceramic electronic component and a volume occupied by the resin component in the inner external electrode, and hence description of other features will not be repeated.

Second Preferred Embodiment

Ceramic electronic component 100 according to the second preferred embodiment of the present invention preferably has an outer dimension of a length not smaller than about 0.95 mm and not greater than about 1.20 mm, a width not smaller than about 0.45 mm and not greater than about 0.70 mm, and a thickness not smaller than about 0.45 mm and not greater than about 0.70 mm, for example.

In the present preferred embodiment, stack 110 preferably has an outer dimension of a length not smaller than about 0.87 mm and not greater than about 1.12 mm, a width not smaller than about 0.41 mm and not greater than about 0.66 mm, and a thickness not smaller than about 0.41 mm and not greater than about 0.66 mm, for example.

In the ceramic electronic component according to the present preferred embodiment, a volume occupied by the resin component in the inner external electrode preferably is not lower than about $5.23 \times 10^{-7}$ ml and not higher than about $2.53 \times 10^{-6}$ ml, for example.

Since a volume occupied by the resin component in the inner external electrode is decreased also in the ceramic electronic component according to the present preferred embodiment, an amount of moisture absorbed by the resin component and an amount of the resin component itself is decreased. Consequently, an amount of water vapor and an amount of a decomposition gas generated in the external electrode through heating in a reflow step in mounting ceramic electronic component 100 are decreased, so that occurrence of solder burst is significantly reduced or prevented.

A ceramic electronic component and a method of manufacturing the same according to a third preferred embodiment of the present invention will be described below. The ceramic electronic component and the method of manufacturing the same according to the third preferred embodiment of the present invention are different from the ceramic electronic component and the method of manufacturing the same according to the first preferred embodiment only in an outer dimension of the ceramic electronic component and a volume occupied by the resin component in the inner external electrode, and hence description of other features will not be repeated.

Third Preferred Embodiment

Ceramic electronic component 100 according to the third preferred embodiment of the present invention preferably has an outer dimension of a length not smaller than about 1.5 mm and not greater than about 1.8 mm, a width not smaller than about 0.7 mm and not greater than about 1.0 mm, and a thickness not smaller than about 0.7 mm and not greater than about 1.0 mm, for example.

In the present preferred embodiment, stack 110 preferably has an outer dimension of a length not smaller than about 1.4 mm and not greater than about 1.7 mm, a width not smaller than about 0.65 mm and not greater than about 0.95 mm, and a thickness not smaller than about 0.65 mm and not greater than about 0.95 mm, for example.

In the ceramic electronic component according to the present preferred embodiment, a volume occupied by the resin component in the inner external electrode preferably is not lower than about $1.94 \times 10^{-6}$ ml and not higher than about $2.84 \times 10^{-6}$ ml, for example.

Since a volume occupied by the resin component in the inner external electrode is decreased also in the ceramic electronic component according to the present preferred embodiment, an amount of moisture absorbed by the resin component and an amount of the resin component itself is decreased. Consequently, an amount of water vapor and an amount of a decomposition gas generated in the external electrode through heating in a reflow step in mounting ceramic electronic component 100 are decreased, so that occurrence of solder burst is significantly decreased.

A position where an external electrode is provided is not limited to opposing end portions of stack 110. A variation of a preferred embodiment of the present invention in which an external electrode is provided at a position other than opposing end portions of stack 110 will be described below.

Figure 6:
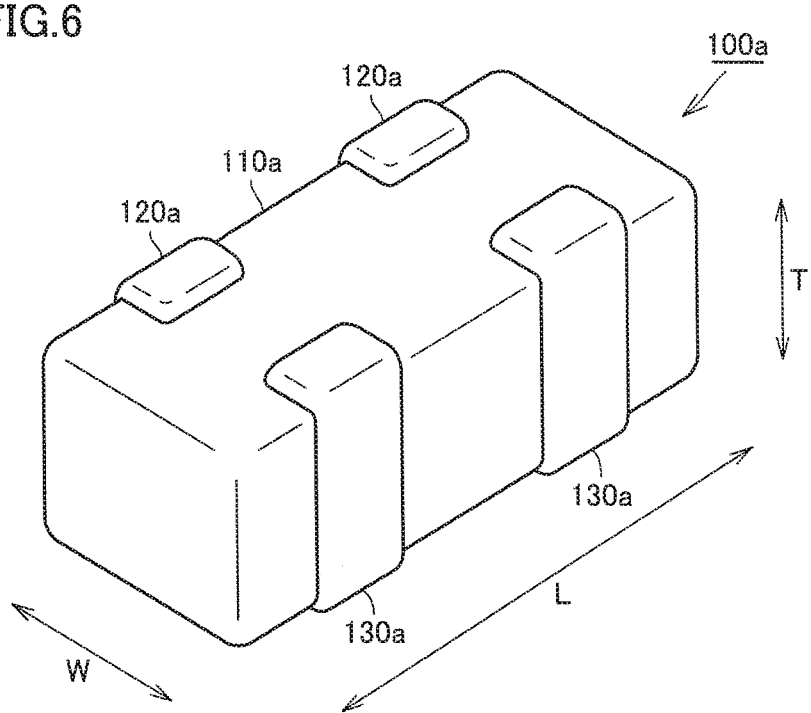
FIG. 6 is a perspective view showing appearance of a ceramic electronic component in a first variation of a preferred embodiment of the present invention.
Figure 7:
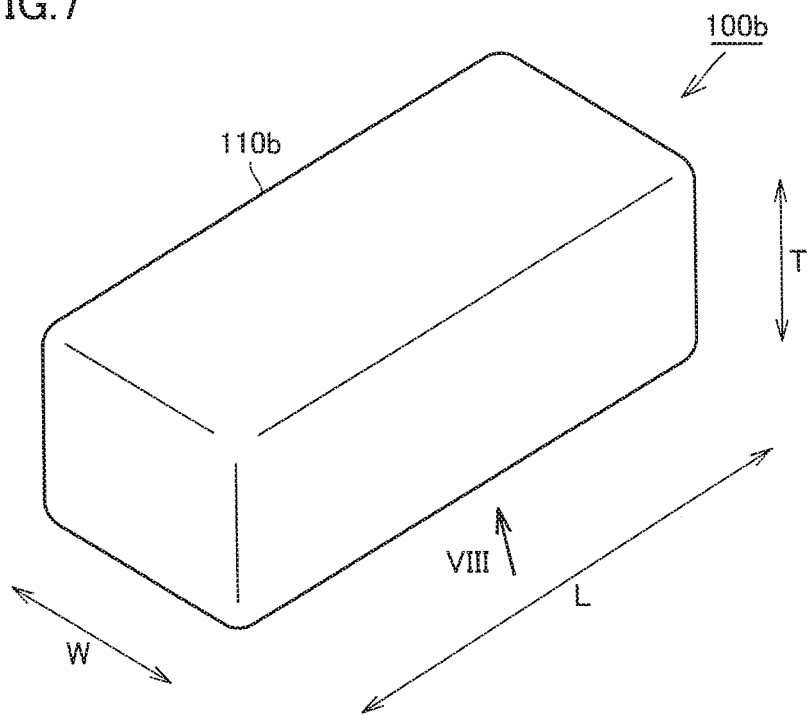
FIG. 7 is a perspective view showing appearance of a ceramic electronic component in a second variation of a preferred embodiment of the present invention.
Figure 8:
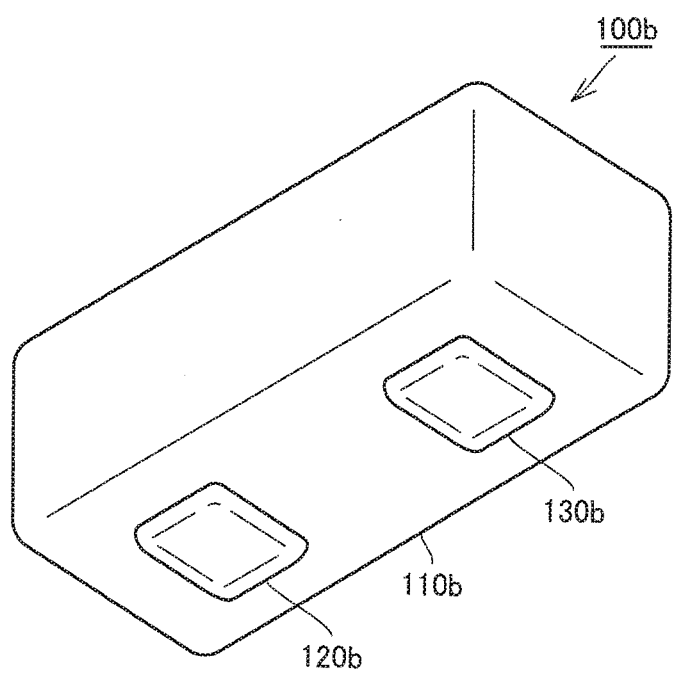
FIG. 8 is a diagram of the ceramic electronic component in FIG. 7 viewed in a direction shown with an arrow VIII.

FIG. 6 is a perspective view showing appearance of a ceramic electronic component in a first variation of a preferred embodiment of the present invention. FIG. 7 is a perspective view showing appearance of a ceramic electronic component in a second variation of a preferred embodiment of the present invention. FIG. 8 is a diagram of the ceramic electronic component in FIG. 7 viewed in a direction shown with an arrow VIII.

As shown in FIG. 6, in a ceramic electronic component 100*a* in the first variation, a first external electrode 120*a* is provided as extending from one side surface of a stack 110*a* to opposing main surfaces. A second external electrode 130*a* is provided as extending from one side surface of stack 110*a* to opposing main surfaces. Ceramic electronic component 100*a* in the first variation is what is called a capacitor array.

As shown in FIGS. 7 and 8, in a ceramic electronic component 100*b* in the second variation, a first external electrode 120*b* is provided on one end surface side on one main surface of stack 110*a*. A second external electrode 130*b* is provided on the other end surface side on one main surface of stack 110*a*. Ceramic electronic component 100*b* in the second variation is what is called a filletless capacitor.

A non-limiting experimental example in which advantageous effects of a preferred embodiment of the present invention were confirmed will be described below.

First Experimental Example

Five hundred ceramic electronic components each preferably having an outer dimension of a length not smaller than about 0.57 mm and not greater than about 0.65 mm, a width not smaller than about 0.27 mm and not greater than about 0.35 mm, and a thickness not smaller than about 0.27 mm and not greater than about 0.35 mm, for example, were fabricated and subjected to an experiment.

Initially, features and conditions common in fabrication of each ceramic electronic component will be described. $BaTiO_3$ was used as a material for forming a ceramic layer. Ni was used as a material for forming an internal electrode. An external electrode was provided at each of opposing end portions of the stack.

A first metal filler was composed of Sn and a second metal filler was composed of Ag. An epoxy resin was used as a resin component. A weight ratio between the first metal filler and the second metal filler in a mixture paste was set to about 3:7. The stack to which the mixture paste had been applied was heated in a nitrogen gas atmosphere for 20 minutes.

A thickness of an inner external electrode preferably was not smaller than about 20 μm and not greater than about 30 μm (a target value was a median value in this range). An outer external electrode was formed from a Ni plating film having a thickness not smaller than about 2 μm and not greater than about 3.5 μm (a target value was a median value in this range). A surface external electrode was formed from a Sn plating film having a thickness not smaller than about 2 μm and not greater than about 3 μm (a target value was a median value in this range).

In Example 1, 100 ceramic electronic components were fabricated, with a volume ratio (a content) of the first metal filler and the second metal filler in total in the mixture paste being set to about 79 volume % and a temperature for heating stack 110 to which the mixture paste had been applied being set to about 550° C.

In Example 2, 100 ceramic electronic components were fabricated, with a volume ratio (a content) of the first metal filler and the second metal filler in total in the mixture paste being set to about 71 volume % and a temperature for heating stack 110 to which the mixture paste had been applied being set to about 450° C.

In Example 3, 100 ceramic electronic components were fabricated, with a volume ratio (a content) of the first metal filler and the second metal filler in total in the mixture paste being set to about 46 volume % and a temperature for heating stack 110 to which the mixture paste had been applied being set to about 450° C.

In Comparative Example 1, 100 ceramic electronic components were fabricated, with a volume ratio (a content) of the first metal filler and the second metal filler in total in the mixture paste being set to about 82 volume % and a temperature for heating stack 110 to which the mixture paste had been applied being set to about 450° C.

In Comparative Example 2, 100 ceramic electronic components were fabricated, with a volume ratio (a content) of the first metal filler and the second metal filler in total in the mixture paste being set to about 40 volume % and a temperature for heating stack 110 to which the mixture paste had been applied being set to about 550° C.

In 100 ceramic electronic components fabricated in each of Examples 1 to 3 and Comparative Examples 1 and 2, an average actually measured value of an outer dimension of the stack, a volume occupied by the resin component in the inner external electrode, an incidence of solder burst, and a ratio of ceramic electronic components detached from a mounting board due to a shock were calculated.

Here, a method of calculating a volume occupied by a resin component in an inner external electrode will be described. Initially, a weight of stack 110 is measured. Then, an amount of increase from the weight of stack 110 is calculated by measuring a weight of the stack after the mixture paste was applied. This amount of increase is the weight of the applied, uncured mixture paste. A weight of a resin contained in the uncured mixture paste is calculated by multiplying the weight of this uncured mixture paste by a weight ratio (a content) of the resin in the uncured mixture paste.

A thermogravimetric/differential thermal analyzer (TG-DTA) is used to measure in advance a weight of the uncured resin component and a weight of the cured resin component with a temperature condition being varied. As a result of this measurement, a tendency of transition of a weight of the resin component in heating at a firing temperature is determined. Specifically, a rate of decrease in weight of the resin component in heating at a firing temperature is determined. Instead of the thermogravimetric/differential thermal analyzer (TG-DTA), a thermogravimetry mass spectrometer (TG-MS) may be used to measure a weight of the uncured resin component and a weight of the cured resin component with a temperature condition being varied.

An amount of decrease of the cured resin is calculated by multiplying a rate of decrease in weight of the resin component determined in advance by a weight of the uncured resin. Therefore, a weight of a resin contained in the cured mixture paste, that is, in the inner external electrode, is calculated by subtracting an amount of decrease in cured resin from the weight of the resin contained in the uncured mixture paste. A volume occupied by the resin contained in the inner external electrode is calculated by dividing the weight of the cured resin by density of the cured resin.

A method below may be used as another method of calculating a volume of the resin component in the inner external electrode. Initially, the external electrode is scraped off from the ceramic electronic component. Then, a thermogravimetric/differential thermal analyzer (TG-DTA) or a thermogravimetry mass spectrometer (TG-MS) is used to measure a weight of the resin component contained in the external electrode which has been scraped off. A volume occupied by the resin contained in the external electrode is calculated by dividing the measured weight of the resin by density of the cured resin. This calculated volume is the volume occupied by the resin component in the inner external electrode.

A method below may be used as yet another method of calculating a volume of the resin component in the inner external electrode. Initially, a volume occupied by the external electrode in the ceramic electronic component is calculated. Specifically, a volume occupied by the external electrode is calculated by subtracting a volume of the stack from a volume of the ceramic electronic component measured with a laser volume meter. Then, the ceramic electronic component is polished such that a cross-section including the external electrode, which is in parallel to the longitudinal direction of the ceramic electronic component, is exposed. A photograph of the exposed cross-section is taken with an SEM. The taken SEM photograph is subjected to binarization and image processing so as to calculate an area ratio between the resin component and the metal component. A volume occupied by the resin contained in the external electrode is estimated by calculating a ratio of an area occupied by the resin component from the calculated area ratio and multiplying this area ratio by the volume occupied by the external electrode. This estimated volume is the volume of the resin component in the inner external electrode.

An incidence of solder burst was calculated as below. After a ceramic electronic component was mounted in a reflow step to a glass epoxy substrate, a state of release of solder was visually checked. An incidence of solder burst was calculated by dividing the number of ceramic electronic components in which solder burst had been observed by the number of mounted ceramic electronic components (100) and further multiplying the result by 100.

A ratio of ceramic electronic components detached from a mounting board due to a shock was calculated as below. A drop test in which a mounting board on which a ceramic electronic component had been mounted was dropped from an altitude of 150 cm while the ceramic electronic component was located above was conducted, and a ratio of detached ceramic electronic components was calculated by dividing the number of ceramic electronic components detached from the mounting board due to drop impact by the number of ceramic electronic components subjected to the drop test and further multiplying the result by 100.

Table 1 summarizes results of experiments in Examples 1 to 3 and Comparative Examples 1 and 2.

TABLE 1

|  | Average Actually Measured Value of Outer Dimension of Stack Length (mm) Width (mm) Thickness (mm) | Volume Ratio of First Metal Filler and Second Metal Filler in Total in Mixture Paste (%) | Temperature for Heating Stack to Which Mixture Paste Was Applied (° C.) | Volume Occupied by Resin Component in Inner External Electrode (ml) | Incidence of Solder Burst (%) | Ratio of Detached Ceramic Electronic Components (%) |
| --- | --- | --- | --- | --- | --- | --- |
| Example 1 | 0.54 0.27 0.27 | 79 | 550 | $3.79 \times 10^{-7}$ | 0 | 0 |
| Example 2 | 0.51 0.24 0.24 | 71 | 450 | $7.41 \times 10^{-7}$ | 0 | 0 |
| Example 3 | 0.59 0.32 0.32 | 46 | 450 | $1.02 \times 10^{-6}$ | 15 | 0 |
| Comparative Example 1 | 0.59 0.32 0.32 | 82 | 450 | $3.26 \times 10^{-7}$ | 0 | 10 |
| Comparative Example 2 | 0.54 0.27 0.27 | 40 | 550 | $1.10 \times 10^{-6}$ | 23 | 0 |

As shown in Table 1, in Example 1, an average actually measured value of an outer dimension of the stack was about 0.54 mm long, about 0.27 mm wide, and about 0.27 mm thick. A volume occupied by the resin component in the inner external electrode was about $3.79 \times 10^{-7}$ ml. An incidence of solder burst was 0%. A ratio of detached ceramic electronic components was 0%.

In Example 2, an average actually measured value of an outer dimension of the stack was about 0.51 mm long, about 0.24 mm wide, and about 0.24 mm thick. A volume occupied by the resin component in the inner external electrode was about $7.41 \times 10^{-7}$ ml. An incidence of solder burst was 0%. A ratio of detached ceramic electronic components was 0%.

In Example 3, an average actually measured value of an outer dimension of the stack was about 0.59 mm long, about 0.32 mm wide, and about 0.32 mm thick. A volume occupied by the resin component in the inner external electrode was about $1.02 \times 10^{-6}$ ml. An incidence of solder burst was about 15%. A ratio of detached ceramic electronic components was 0%.

In Comparative Example 1, an average actually measured value of an outer dimension of the stack was 0.59 mm long, 0.32 mm wide, and 0.32 mm thick. A volume occupied by the resin component in the inner external electrode was $3.26\times10^{-7}$ ml. An incidence of solder burst was 0%. A ratio of detached ceramic electronic components was 10%.

In Comparative Example 2, an average actually measured value of an outer dimension of the stack was 0.54 mm long, 0.27 mm wide, and 0.27 mm thick. A volume occupied by the resin component in the inner external electrode was $1.10\times10^{-6}$ ml. An incidence of solder burst was 23%. A ratio of detached ceramic electronic components was 0%.

In the present experimental example, it was confirmed that an incidence of solder burst lowered as a volume occupied by the resin component in the inner external electrode was smaller. Detachment of a ceramic electronic component from a mounting board due to a shock was observed when a volume occupied by the resin component in the inner external electrode was too small.

An incidence of solder burst is preferably not higher than about 15%. A ratio of detached ceramic electronic components is preferably 0%. In a ceramic electronic component having an outer dimension of a length not smaller than about 0.57 mm and not greater than about 0.65 mm, a width not smaller than about 0.27 mm and not greater than 0.35 mm, and a thickness not smaller than 0.27 mm and not greater than 0.35 mm, it could be confirmed that a ratio of detached ceramic electronic components could be 0% while an incidence of solder burst was not higher than about 15%, by setting a volume occupied by the resin component in the inner external electrode to be not lower than about $3.79\times10^{-7}$ ml and not higher than about $1.02\times10^{-6}$ ml.

Second Experimental Example

Five hundred ceramic electronic components each having an outer dimension of a length not smaller than about 0.95 mm and not greater than about 1.20 mm, a width not smaller than about 0.45 mm and not greater than about 0.70 mm, and a thickness not smaller than about 0.45 mm and not greater than about 0.70 mm were fabricated and subjected to an experiment.

Initially, features and conditions common in fabrication of each ceramic electronic component will be described. $BaTiO_3$ was used as a material for forming a ceramic layer. Ni was used as a material forming an internal electrode.

A first metal filler was composed of Sn and a second metal filler was composed of Ag. An epoxy resin was used as a resin component. A weight ratio between the first metal filler and the second metal filler in a mixture paste was set to about 3:7. The stack to which the mixture paste had been applied was heated in a nitrogen gas atmosphere for 20 minutes.

A thickness of an inner external electrode was not smaller than about 20 µm and not greater than about 30 µm (a target value was a median value in this range). An outer external electrode was formed from a Ni plating film having a thickness not smaller than about 2 µm and not greater than about 3.5 µm (a target value was a median value in this range). A surface external electrode was formed from a Sn plating film having a thickness not smaller than about 2 µm and not greater than about 3 µm (a target value was a median value in this range).

In Example 4, 100 ceramic electronic components were fabricated, with a volume ratio (a content) of the first metal filler and the second metal filler in total in the mixture paste being set to about 82 volume % and a temperature for heating stack 110 to which the mixture paste had been applied being set to about ° C.

In Example 5, 100 ceramic electronic components were fabricated, with a volume ratio (a content) of the first metal filler and the second metal filler in total in the mixture paste being set to about 79 volume % and a temperature for heating stack 110 to which the mixture paste had been applied being set to about 550° C.

In Example 6, 100 ceramic electronic components were fabricated, with a volume ratio (a content) of the first metal filler and the second metal filler in total in the mixture paste being set to about 60 volume % and a temperature for heating stack 110 to which the mixture paste had been applied being set to about 450° C.

In Comparative Example 3, 100 ceramic electronic components were fabricated, with a volume ratio (a content) of the first metal filler and the second metal filler in total in the mixture paste being set to 85 volume % and a temperature for heating stack 110 to which the mixture paste had been applied being set to 450° C.

In Comparative Example 4, 100 ceramic electronic components were fabricated, with a volume ratio (a content) of the first metal filler and the second metal filler in total in the mixture paste being set to 46 volume % and a temperature for heating stack 110 to which the mixture paste had been applied being set to 550° C.

In 100 ceramic electronic components fabricated in each of Examples 4 to 6 and Comparative Examples 3 and 4, an average actually measured value of an outer dimension of the stack, a volume occupied by the resin component in the inner external electrode, an incidence of solder burst, and a ratio of ceramic electronic components detached from a mounting board due to a shock were calculated.

Table 2 summarizes results of experiments in Examples 4 to 6 and Comparative Examples 3 and 4.

TABLE 2

| | Average Actually Measured Value of Outer Dimension of Stack Length (mm) Width (mm) Thickness (mm) | Volume Ratio of First Metal Filler and Second Metal Filler in Total in Mixture Paste (%) | Temperature for Heating Stack to Which Mixture Paste Was Applied (° C.) | Volume Occupied by Resin Component in Inner External Electrode (ml) | Incidence of Solder Burst (%) | Ratio of Detached Ceramic Electronic Components (%) |
|---|---|---|---|---|---|---|
| Example 4 | 0.92 0.46 0.46 | 82 | 450 | $5.23 \times 10^{-7}$ | 0 | 0 |
| Example 5 | 0.92 0.46 | 79 | 550 | $6.47 \times 10^{-7}$ | 0 | 0 |

TABLE 2-continued

| | Average Actually Measured Value of Outer Dimension of Stack Length (mm) Width (mm) Thickness (mm) | Volume Ratio of First Metal Filler and Second Metal Filler in Total in Mixture Paste (%) | Temperature for Heating Stack to Which Mixture Paste Was Applied (° C.) | Volume Occupied by Resin Component in Inner External Electrode (ml) | Incidence of Solder Burst (%) | Ratio of Detached Ceramic Electronic Components (%) |
|---|---|---|---|---|---|---|
| Example 6 | 0.46 1.12 0.66 | 60 | 450 | $2.53 \times 10^{-6}$ | 11 | 0 |
| Comparative Example 3 | 0.66 0.92 0.46 | 85 | 450 | $3.39 \times 10^{-7}$ | 0 | 15 |
| Comparative Example 4 | 0.46 0.87 0.41 0.41 | 46 | 550 | $2.64 \times 10^{-6}$ | 21 | 0 |

As shown in Table 2, in Example 4, an average actually measured value of an outer dimension of the stack was about 0.92 mm long, about 0.46 mm wide, and about 0.46 mm thick. A volume occupied by the resin component in the inner external electrode was about $5.23 \times 10^{-7}$ ml. An incidence of solder burst was 0%. A ratio of detached ceramic electronic components was 0%.

In Example 5, an average actually measured value of an outer dimension of the stack was about 0.92 mm long, about 0.46 mm wide, and about 0.46 mm thick. A volume occupied by the resin component in the inner external electrode was about $6.47 \times 10^{-7}$ ml. An incidence of solder burst was 0%. A ratio of detached ceramic electronic components was 0%.

In Example 6, an average actually measured value of an outer dimension of the stack was about 1.12 mm long, about 0.66 mm wide, and about 0.66 mm thick. A volume occupied by the resin component in the inner external electrode was about $2.53 \times 10^{-6}$ ml. An incidence of solder burst was about 11%. A ratio of detached ceramic electronic components was 0%.

In Comparative Example 3, an average actually measured value of an outer dimension of the stack was 0.92 mm long, 0.46 mm wide, and 0.46 mm thick. A volume occupied by the resin component in the inner external electrode was $3.39 \times 10^{-7}$ ml. An incidence of solder burst was 0%. A ratio of detached ceramic electronic components was 15%.

In Comparative Example 4, an average actually measured value of an outer dimension of the stack was 0.87 mm long, 0.41 mm wide, and 0.41 mm thick. A volume occupied by the resin component in the inner external electrode was $2.64 \times 10^{-6}$ ml. An incidence of solder burst was 21%. A ratio of detached ceramic electronic components was 0%.

In the present experimental example as well, it was confirmed that an incidence of solder burst lowered as a volume occupied by the resin component in the inner external electrode was smaller. Detachment of a ceramic electronic component from a mounting board due to a shock was observed when a volume occupied by the resin component in the inner external electrode was too small.

In a ceramic electronic component having an outer dimension of a length not smaller than about 0.95 mm and not greater than about 1.20 mm, a width not smaller than about 0.45 mm and not greater than about 0.70 mm, and a thickness not smaller than about 0.45 mm and not greater than about 0.70 mm, it could be confirmed that a ratio of detached ceramic electronic components could be 0% while an incidence of solder burst was not higher than about 15%, by setting a volume occupied by the resin component in the inner external electrode to be not lower than about $5.23 \times 10^{-7}$ ml and not higher than about $2.53 \times 10^{-6}$ ml.

Third Experimental Example

Five hundred ceramic electronic components each having an outer dimension of a length not smaller than about 1.5 mm and not greater than about 1.8 mm, a width not smaller than about 0.7 mm and not greater than about 1.0 mm, and a thickness not smaller than about 0.7 mm and not greater than about 1.0 mm were fabricated and subjected to an experiment.

Initially, features and conditions common in fabrication of each ceramic electronic component will be described. $BaTiO_3$ was used as a material for forming a ceramic layer. Ni was used as a material forming an internal electrode.

A first metal filler was composed of Sn and a second metal filler was composed of Ag. An epoxy resin was used as a resin component. A weight ratio between the first metal filler and the second metal filler in a mixture paste was set to about 3:7. The stack to which the mixture paste had been applied was heated in a nitrogen gas atmosphere for 20 minutes.

A thickness of an inner external electrode was not smaller than about 20 μm and not greater than about 30 μm. An outer external electrode was formed from a Ni plating film having a thickness not smaller than about 2 μm and not greater than about 3.5 μm. A surface external electrode was formed from a Sn plating film having a thickness not smaller than about 2 μm and not greater than about 3 μm.

In Example 7, 100 ceramic electronic components were fabricated, with a volume ratio (a content) of the first metal filler and the second metal filler in total in the mixture paste being set to about 79 volume % and a temperature for heating stack 110 to which the mixture paste had been applied being set to about 550° C.

In Example 8, 100 ceramic electronic components were fabricated, with a volume ratio (a content) of the first metal filler and the second metal filler in total in the mixture paste being set to about 71 volume % and a temperature for heating stack 110 to which the mixture paste had been applied being set to about 550° C.

In Example 9, 100 ceramic electronic components were fabricated, with a volume ratio (a content) of the first metal filler and the second metal filler in total in the mixture paste being set to 79 volume % and a temperature for heating stack 110 to which the mixture paste had been applied being set to 450° C.

In Comparative Example 5, 100 ceramic electronic components were fabricated, with a volume ratio (a content) of the first metal filler and the second metal filler in total in the mixture paste being set to about 82 volume % and a temperature for heating stack 110 to which the mixture paste had been applied being set to about 450° C.

In Comparative Example 6, 100 ceramic electronic components were fabricated, with a volume ratio (a content) of the first metal filler and the second metal filler in total in the mixture paste being set to about 71 volume % and a temperature for heating stack 110 to which the mixture paste had been applied being set to about 450° C.

In 100 ceramic electronic components fabricated in each of Examples 7 to 9 and Comparative Examples 5 and 6, an average actually measured value of an outer dimension of the stack, a volume occupied by the resin component in the inner external electrode, an incidence of solder burst, and a ratio of ceramic electronic components detached from a mounting board due to a shock were calculated.

Table 3 summarizes results of experiments in Examples 7 to 9 and Comparative Examples 5 and 6.

In Example 9, an average actually measured value of an outer dimension of the stack was about 1.70 mm long, about 0.95 mm wide, and about 0.95 mm thick. A volume occupied by the resin component in the inner external electrode was about $2.84 \times 10^{-6}$ ml. An incidence of solder burst was about 14%. A ratio of detached ceramic electronic components was 0%.

In Comparative Example 5, an average actually measured value of an outer dimension of the stack was 1.50 mm long, 0.75 mm wide, and 0.75 mm thick. A volume occupied by the resin component in the inner external electrode was $1.60 \times 10^{-6}$ ml. An incidence of solder burst was 7%. A ratio of detached ceramic electronic components was 20%.

In Comparative Example 6, an average actually measured value of an outer dimension of the stack was 1.50 mm long, 0.75 mm wide, and 0.75 mm thick. A volume occupied by the resin component in the inner external electrode was $4.23 \times 10^{-6}$ ml. An incidence of solder burst was 58%. A ratio of detached ceramic electronic components was 0%.

In the present experimental example as well, it was confirmed that an incidence of solder burst lowered as a volume occupied by the resin component in the inner external electrode was smaller. Detachment of a ceramic electronic component from a mounting board due to a shock was observed when a volume occupied by the resin component in the inner external electrode was too small.

TABLE 3

| | Average Actually Measured Value of Outer Dimension of Stack Length (mm) Width (mm) Thickness (mm) | Volume Ratio of First Metal Filler and Second Metal Filler in total in Mixture Paste (%) | Temperature for Heating Stack to Which Mixture Paste Was Applied (° C.) | Volume Occupied by Resin Component in Inner External Electrode (ml) | Incidence of Solder Burst (%) | Ratio of Detached Ceramic Electronic Component (%) |
|---|---|---|---|---|---|---|
| Example 7 | 1.50 0.75 0.75 | 79 | 550 | $1.94 \times 10^{-6}$ | 13 | 0 |
| Example 8 | 1.40 0.65 0.65 | 71 | 550 | $2.44 \times 10^{-6}$ | 10 | 0 |
| Example 9 | 1.70 0.95 0.95 | 79 | 450 | $2.84 \times 10^{-6}$ | 14 | 0 |
| Comparative Example 5 | 1.50 0.75 0.75 | 82 | 450 | $1.60 \times 10^{-6}$ | 7 | 20 |
| Comparative Example 6 | 1.50 0.75 0.75 | 71 | 450 | $4.23 \times 10^{-6}$ | 58 | 0 |

As shown in Table 3, in Example 7, an average actually measured value of an outer dimension of the stack was about 1.50 mm long, about 0.75 mm wide, and about 0.75 mm thick. A volume occupied by the resin component in the inner external electrode was about $1.94 \times 10^{-6}$ ml. An incidence of solder burst was about 13%. A ratio of detached ceramic electronic components was 0%.

In Example 8, an average actually measured value of an outer dimension of the stack was about 1.40 mm long, about 0.65 mm wide, and about 0.65 mm thick. A volume occupied by the resin component in the inner external electrode was about $2.44 \times 10^{-6}$ ml. An incidence of solder burst was about 10%. A ratio of detached ceramic electronic components was 0%.

In a ceramic electronic component preferably having an outer dimension of a length not smaller than about 1.5 mm and not greater than about 1.8 mm, a width not smaller than about 0.7 mm and not greater than about 1.0 mm, and a thickness not smaller than about 0.7 mm and not greater than about 1.0 mm, it could be confirmed that a ratio of detached ceramic electronic components could be 0% while an incidence of solder burst was not higher than about 15%, by setting a volume occupied by the resin component in the inner external electrode to be not lower than about $1.94 \times 10^{-6}$ ml and not higher than about $2.84 \times 10^{-6}$ ml, for example.

It was also confirmed that, in a case that a temperature for heating stack 110 to which the mixture paste had been applied was set to about 800° C., the resin component was not substantially contained in the formed inner external electrode. This may be because the resin component was released from the mixture paste and disappeared.

From the experimental results above, it was confirmed that occurrence of solder burst was significantly reduced or prevented while a function of the inner external electrode as a buffer layer was maintained, by providing in the inner external electrode, the resin component in an amount within a prescribed range.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method of manufacturing a ceramic electronic component having an outer dimension of a length not smaller than about 0.57 mm and not greater than about 0.65 mm, a width not smaller than about 0.27 mm and not greater than about 0.35 mm, and a thickness not smaller than about 0.27 mm and not greater than about 0.35 mm, the method comprising the steps of:
    preparing a rectangular or substantially rectangular parallelepiped-shaped stack in which a ceramic layer and an internal electrode are alternately stacked; and
    providing an external electrode on a portion of a surface of the stack so as to electrically be connected to the internal electrode; wherein
    the step of providing an external electrode includes the steps of providing an inner external electrode by applying a mixture of a resin component and a metal component so as to cover a portion of the surface of the stack and heating the stack onto which the mixture has been applied and providing an outer external electrode by plating the inner external electrode with a metal component so as to cover the inner external electrode; and
    the metal component of the inner external electrode includes a first metal component and a second metal component higher in melting point than the first metal components.

2. A method of manufacturing a ceramic electronic component having an outer dimension of a length not smaller than about 0.95 mm and not greater than about 1.20 mm, a width not smaller than about 0.45 mm and not greater than about 0.70 mm, and a thickness not smaller than about 0.45 mm and not greater than about 0.70 mm, the method comprising the steps of:
    preparing a rectangular or substantially rectangular parallelepiped-shaped stack in which a ceramic layer and an internal electrode are alternately stacked; and
    providing an external electrode on a portion of a surface of the stack so as to electrically be connected to the internal electrode; wherein
    the step of providing an external electrode includes the steps of providing an inner external electrode by applying a mixture of a resin component and a metal component so as to cover a portion of the surface of the stack and heating the stack onto which the mixture has been applied and providing an outer external electrode by plating the inner external electrode with a metal component so as to cover the inner external electrode; and
    the metal component of the inner external electrode includes a first metal component and a second metal component higher in melting point than the first metal component.

3. A method of manufacturing a ceramic electronic component having an outer dimension of a length not smaller than about 1.5 mm and not greater than about 1.8 mm, a width not smaller than about 0.7 mm and not greater than about 1.0 mm, and a thickness not smaller than about 0.7 mm and not greater than about 1.0 mm, the method comprising the steps of:
    preparing a rectangular or substantially rectangular parallelepiped-shaped stack in which a ceramic layer and an internal electrode are alternately stacked; and
    providing an external electrode on a portion of a surface of the stack so as to electrically be connected to the internal electrode; wherein
    the step of providing an external electrode includes the steps of providing an inner external electrode by applying a mixture of a resin component and a metal component so as to cover a portion of the surface of the stack and heating the stack onto which the mixture has been applied and providing an outer external electrode by plating the inner external electrode with a metal component so as to cover the inner external electrode; and
    the metal component of the inner external electrode includes a first metal component and a second metal component higher in melting point than the first metal component.

4. The method of manufacturing a ceramic electronic component according to claim 1, wherein the first metal component is Sn.

5. The method of manufacturing a ceramic electronic component according to claim 1, wherein the second metal component is Ag or Cu.

6. The method of manufacturing a ceramic electronic component according to claim 1, wherein the metal component of the outer external electrode is Ni.

7. The method of manufacturing a ceramic electronic component according to claim 1, wherein a temperature for heating the stack in the step of providing an inner external electrode is not lower than about 450° C.

8. The method of manufacturing a ceramic electronic component according to claim 1, wherein in the step of providing an inner external electrode, the stack is heated in an atmosphere in which a concentration of oxygen is not higher than about 100 ppm.

\* \* \* \* \*